(12) United States Patent
Doi et al.

(10) Patent No.: US 6,734,030 B2
(45) Date of Patent: May 11, 2004

(54) SEMICONDUCTOR LIGHT EMITTING DEVICE AND METHOD OF FABRICATING SEMICONDUCTOR LIGHT EMITTING DEVICE

(75) Inventors: Masato Doi, Kanagawa (JP); Hiroyuki Okuyama, Kanagawa (JP); Goshi Biwa, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/093,339

(22) Filed: Mar. 6, 2002

(65) Prior Publication Data

US 2003/0017633 A1 Jan. 23, 2003

(30) Foreign Application Priority Data

Mar. 6, 2001 (JP) ........................................ 2001-061174

(51) Int. Cl.[7] .............................................. H01L 21/00
(52) U.S. Cl. .......................................... 438/22; 257/88
(58) Field of Search ............................... 438/33, 34, 22, 438/39, 38; 257/88, 93

(56) References Cited

U.S. PATENT DOCUMENTS 5,501,990 A * 3/1996 Holm et al. .................... 437/23

FOREIGN PATENT DOCUMENTS

| JP | 56-92577 | 7/1981 |
| JP | 57-45583 | 3/1982 |
| JP | 57-52071 | 3/1982 |
| JP | 57-52072 | 3/1982 |
| JP | 57-52073 | 3/1982 |
| JP | 58-50577 | 3/1983 |

(List continued on next page.)

OTHER PUBLICATIONS

Applied Physics Letters, vol. 76, Number 22, May 29, 2000, *Selective Growth Of InGaN Quantum Dot Structures And Their Microphotoluminescence At Room Temperature*, Tachibana et al., pp. 3212–3214.

Journal of Crystal Growth 189/190 (1998) 83–86, *Spatial Control Of InGaN Luminescence By MOCVD Selective Epitaxy*, Kaplnek et al.

Journal of Crystal Growth, vol. 204, No. 3, Jul. 11 (1999), *Single–Crystal GaN Pyramids Grown On (111)Si Substrates By Selective Lateral* Overgrowth, Stringfellow et al., pp. 270–274.

J. Wang et al., *Fabrication Of Nanoscale Of InGaN By MOCVD Lateral Overgrowth*, Journal of Crystal Growth 197 (1999), pp. 48–53.

Raj Singh et al., *Selective Area Growth of GaN Directly on (0001) Sapphire by The HVPE Technique*, MRS Internet Journal Nitride Semiconductor Research, 3, 13 (1998), pp. 1–4.

(List continued on next page.)

*Primary Examiner*—David Nelms
*Assistant Examiner*—Quoc Hoang
(74) *Attorney, Agent, or Firm*—Bell, Boyd & Lloyd LLC

(57) ABSTRACT

Semiconductor light emitting devices and a method of fabricating the semiconductor light emitting devices are provided. The semiconductor light emitting device includes a growth substrate, a first growth layer formed on the growth substrate, a growth obstruction film formed on the first growth layer, and a second growth layer formed by selective growth from an opening portion formed in the growth obstruction film, wherein device isolation trenches for isolating devices from each other are formed in the first growth layer formed on the growth substrate, and the second growth layer is formed by selective growth after formation of the device isolation trenches.

17 Claims, 7 Drawing Sheets

FOREIGN PATENT DOCUMENTS

| | | |
|---|---|---|
| JP | 61-156780 | 7/1986 |
| JP | 63-188938 | 8/1988 |
| JP | 2-263668 | 10/1990 |
| JP | 3-035568 | 2/1991 |
| JP | 6-067044 | 3/1994 |
| JP | 7-199829 | 4/1995 |
| JP | 7-122520 | 5/1995 |
| JP | 8-008217 | 1/1996 |
| JP | 8-236867 | 9/1996 |
| JP | 8-255929 | 10/1996 |
| JP | 9-129974 | 5/1997 |
| JP | 9-199419 | 7/1997 |
| JP | 10-265297 | 10/1998 |
| JP | 10-270801 | 10/1998 |
| JP | 10-312971 | 11/1998 |
| JP | 10-321910 | 12/1998 |
| JP | 11-26883 | 1/1999 |
| JP | 11-075019 | 3/1999 |
| JP | 11-154648 | 6/1999 |
| JP | 11-177138 | 7/1999 |
| JP | 11-238687 | 8/1999 |
| JP | 11-251253 | 9/1999 |
| JP | 11-274568 | 10/1999 |
| JP | 11-312840 | 11/1999 |
| JP | 11-330532 | 11/1999 |
| JP | 11-514136 | 11/1999 |
| JP | 11-346004 | 12/1999 |
| JP | 2000-012976 | 1/2000 |
| JP | 2000-068593 | 3/2000 |
| JP | 2000-150391 | 5/2000 |
| JP | 2000-183451 | 6/2000 |
| JP | 2000-223417 | 8/2000 |
| JP | 2001-085738 | 3/2001 |
| JP | 2001-217503 | 8/2001 |
| JP | 2002-185660 | 12/2002 |
| WO | WO 97/44612 | 11/1997 |

OTHER PUBLICATIONS

Zhigang Mao, et al., *Defects in GaN Pyramids Grown on Si(111) Substrates by Selective Lateral Overgrowth*, pp. 1–6; Materials Research Society Meeting in Boston, Mass. (1998).

Kapolnek e tal., *Spatial Control of InGaN Luminescence by MOCVD Selective Epitaxy*, Journal of Crystal Growth, 189/190 (1998) pp. 83–86.

* cited by examiner

SEMICONDUCTOR LIGHT EMITTING DEVICE AND METHOD OF FABRICATING SEMICONDUCTOR LIGHT EMITTING DEVICE

BACKGROUND OF THE INVENTION

The present invention relates to semiconductor light emitting devices and processes for producing same. More particularly, the present invention relates to a semiconductor light emitting device fabricated by forming a growth layer having a stacked structure of a first conductive layer, a light emission layer, and a second conductive layer by selective growth on a growth substrate, and a method of fabricating the semiconductor light emitting device, the semiconductor light emitting device being fabricated by forming a wurtzite type compound semiconductor layer such as a gallium nitride based compound semiconductor layer by selective growth.

Conventionally, when manufacturing a semiconductor light emitting device of this type, a device is fabricated by forming a low temperature buffer layer overall on a sapphire substrate, forming an n-side contact layer made from Si-doped GaN thereon, and stacking, on the n-side contact layer, an n-side cladding layer made from Si-doped GaN, an active layer made from Si-doped InGaN, a p-side cladding layer made from Mg-doped AlGaN, and a p-side contact layer made from Mg-doped GaN. As commercial products of semiconductor light emitting devices having such a structure, light emitting diodes and semiconductor lasers allowing emission of light of blue and green in a wavelength ranging from 450 nm to 530 nm have been fabricated on a large scale.

A sapphire substrate has been often used for growing gallium nitride thereon. However, dislocations may occur in crystal, at a high density, due to mismatches between crystal lattices of the sapphire substrate and gallium nitride. A method of forming a low temperature buffer layer on a substrate is one way of suppressing such defects occurring in crystal during growth thereof. In a method disclosed in Japanese Patent Laid-open No. Hei 10-312971, usual crystal growth is combined with selective crystal growth in the lateral direction (ELO: Epitaxial Lateral Overgrowth) for reducing crystal defects. The method of fabricating a semiconductor light emitting device disclosed in Japanese Patent Laid-open No. Hei 10-312971 has also described that through-dislocations propagated in the direction perpendicular to a principal plane of a substrate are bent in the lateral direction by a facet structure formed in a growth region during fabrication and are thereby prevented from being further propagated, thereby reducing crystal defects.

On the other hand, there has been known a method of fabricating a semiconductor light emitting device in a fine region by forming a layer of a nitride based semiconductor such as GaN into a pyramid shape by selective growth. In particular, a method of fabricating a light emitting device by forming a hexagonal pyramid shaped nitride based semiconductor layer by selective growth has been disclosed, for example, in "Spatial Control of InGaN Luminescence by MOCVD Selective Epitaxy, D. Kapolnek et al., Journal of Crystal Growth, 189/190 (1998) 83–86". According to the selective growth technique described in this document, a plurality of nitride based semiconductor light emitting devices, each of which is composed of a fine hexagonal pyramid shaped GaN/InGaN layer structure, can be formed. With respect to such a fine hexagonal pyramid shaped light emitting device, it has been known that an active layer is formed on an S-plane (i.e., a (1–101) plane) formed in self-alignment, thereby improving crystallinity and light emergence efficiency.

When forming a light emitting device composed of a hexagonal pyramid shaped nitride based semiconductor layer having a stacked structure by selective growth, a p-side electrode and an n-side electrode are required to be formed on a selectively grown stacked layer for supplying a current to a light emission layer. In general, at the time of selective growth, a p-side conductive layer is stacked on an inside conductive layer. Accordingly, to form both n-side and p-side electrodes, part of the p-side conductive layer must be removed by etching or the like. To be more specific, an n-side electrode is typically formed by forming an n-type first growth layer, forming a growth obstruction film for selective growth on the first growth layer, forming a second growth layer by selective growth, forming a window in the growth obstruction film at a position where the second growth layer is not formed, and forming the n-side electrode in the window.

FIGS. 4A and 4B are views showing a hexagonal pyramid shaped semiconductor light emitting device formed by typical selective growth. As shown in FIG. 4A, a first growth layer 81 made from GaN or AlN is formed on a sapphire substrate 80, and a growth obstruction film 82 made from silicon oxide or silicon nitride is formed on the first growth layer 81. Subsequently, in each device region, an opening portion 83 is formed in the growth obstruction film 82, and a second growth layer is formed by selective growth from the opening portion 83. The second growth layer has a stacked structure of an n-type first conductive layer 84, an active layer 85, and a p-type second conductive layer 86.

The second growth layer is a hexagonal pyramid shaped growth layer, and a p-side electrode 87 is formed on the second conductive layer 86 as the outermost portion of the second growth layer. On the other hand, in each device region, a window 89 is formed in the growth obstruction film 82, and an n-side electrode 88 is formed in the window 89. After formation of the n-side electrodes 88 and the p-side electrodes 87, as shown in FIG. 4B, device isolation for isolating light emitting devices from each other is performed. To be electrically connected to the n-side electrodes 88, the first growth layer 81 positioned under the growth obstruction film 82 is doped with an n-type impurity. Such a conductive first growth layer 81 is required to be divided into parts belonging to respective device regions. The device isolation is generally preformed by forming device isolation trenches 90 by etching. A principal plane of the sapphire substrate 80 is exposed at bottoms of the device isolation trenches 90.

When fabricating light emitting devices by forming growth layer portions each having a hexagonal pyramid or a truncated shape thereof, or another pyramid shape or a truncated shape thereof by selective growth and independently driving respective devices or transferring or mounting respective devices on another substrate, the first growth layer 81 as an under growth layer must be isolated into parts belonging to respective device regions.

In this case, however, since the second growth layer is formed into a hexagonal pyramid shape or another pyramid shape by selective growth from the opening portion formed in the growth obstruction film at a position in each device region, there is a relatively large difference-in-height between a top portion of the pyramid shaped second growth layer and the surface of the growth obstruction layer. In particular, the surface portion of the growth obstruction film becomes the recessed side of the difference-in-height. As a result, the device isolation trenches 90 for isolating the devices from each other must be formed in the recessed regions by etching. Because of the difference-in-height between the top portion of the second growth layer and the surface of the growth obstruction film 82, it is not easy to form the device isolation trenches 90 with desirable repeatability, and in the worst case, device isolation becomes impossible due to positional deviation of a mask for forming the device isolation trenches.

SUMMARY OF THE INVENTION

An object of the present invention is, therefore, to provide a semiconductor light emitting device and a method of fabricating the semiconductor light emitting device, which are capable of isolating respective devices from each other with desirable repeatability.

According to an embodiment of the present invention, a semiconductor light emitting device is provided. The device includes a growth substrate, a first growth layer formed on the growth substrate, a growth obstruction film formed on the first growth layer; and a second growth layer formed by selective growth from an opening portion formed in the growth obstruction film. The second growth layer has a stacked structure of a first conductive layer, a light emission layer, and a second conductive layer. The device further includes device isolation trenches for isolating devices from each other. The trenches are formed in the first growth layer formed on the growth substrate. Preferably, the second growth layer is formed by selective growth after formation of the device isolation trenches.

With this configuration, since the device isolation trenches for isolating respective devices from each other are formed in the first growth layer, the first growth layer can be electrically isolated into parts belonging to respective device regions. In this regard, the device isolation trenches are preferably formed before the formation of the growth layer by selective growth. Accordingly, at the time of formation of the device isolation trenches, the pyramid or polygonal shaped growth layer is not yet formed. Thus, irregularities on the substrate are small. Accordingly, the device isolation trenches can be formed with desirable repeatability.

According to another embodiment of the present invention, a method of fabricating a semiconductor light emitting device is provided. The method includes the steps of forming a first growth layer on a growth substrate, forming device isolation trenches for isolating devices from each other in the first growth layer, forming a growth obstruction film having a specific opening portion in the first growth layer in which the device isolation trenches have been formed, and forming a second growth layer by selective growth from the opening portion. Preferably, the second growth layer has a stacked structure of a first conductive layer, a light emission layer, and a second conductive layer.

With this configuration, the selective growth step is performed after the step of forming the device isolation trenches for isolating respective devices from each other. Accordingly, at the time of formation of the device isolation trenches, the growth layer is not yet formed. Thus, the device isolation trenches can be formed with good or desirable repeatability. Since the growth obstruction film on the first growth layer is formed after the formation of the device isolation trenches, the growth obstruction film is formed even on side walls of the device isolation trenches. As a result, since a surface area of the growth obstruction film on the substrate becomes large, it is possible to supply a larger amount of source gases required for selective growth onto the opening portions formed in the growth obstruction film.

Additional features and advantages of the present invention are described in, and will be apparent from, the following Detailed Description of the Invention and the Figures.

BRIEF DESCRIPTION OF THE FIGURES

FIGS. 1A to 1H are sectional views of fragmental structures of a semiconductor light emitting device according to a first embodiment of the present invention, illustrating steps of fabricating the semiconductor light emitting device, wherein FIG. 1A shows a step of forming a first growth layer, FIG. 1B shows a step of forming device isolation trenches, FIG. 1C shows a step of forming a growth obstruction film, FIG. 1D shows a step of forming opening portions in the growth obstruction film, FIG. 1E shows a step of forming a second growth layer, FIG. 1F shows a step of forming opening portions for electrodes, FIG. 1G shows a step of forming electrodes, and FIG. 1H shows a step of isolating devices from each other by abrasion.

FIGS. 2A to 2C are sectional views of fragmental structures of a semiconductor light emitting device according to a second embodiment of the present invention, illustrating steps of fabricating the semiconductor light emitting device, wherein FIG. 2A shows a step of forming device isolation trenches, FIG. 2B shows a step of forming a growth obstruction film, and FIG. 2C shows a step of forming electrodes for light emitting devices.

FIGS. 3A to 3F are sectional views of fragmental structures of a semiconductor light emitting device according to a third embodiment of the present invention, illustrating steps of fabricating the semiconductor light emitting device, wherein FIG. 3A shows a step of forming a first growth layer, FIG. 3B shows a step of forming device isolation trenches, FIG. 3C shows a step of forming a growth obstruction film, FIG. 3D shows a step of forming a second growth layer, FIG. 3E shows a step of forming opening portions, and FIG. 3F shows a step of forming electrodes.

FIGS. 4A and 4B are views showing one example of a related art semiconductor light emitting device, illustrating steps of fabricating the semiconductor light emitting device, wherein FIG. 4A shows steps before a step of forming device isolation trenches, and FIG. 4B shows the step of forming the device isolation trenches.

DETAILED DESCRIPTION OF THE INVENTION

First Embodiment

A semiconductor light emitting device and a method of fabricating the semiconductor light emitting device according to a first embodiment will be described with reference to FIGS. 1A to 1H. In this embodiment, the semiconductor light emitting device is fabricated by forming wurtzite type compound semiconductor layers such as gallium nitride based compound semiconductor layers by selective growth.

Figure 1A:
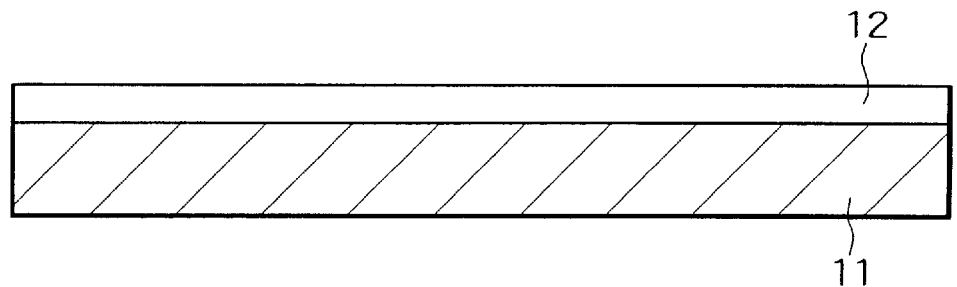

Referring first to FIG. 1A, a first growth layer 12 is formed on a growth substrate 11. As the growth substrate 11, there can be used any kind of substrate insofar as a wurtzite type compound semiconductor layer can be formed thereon. For example, there can be used a substrate made from sapphire ($Al_2O_3$, whose desirable crystal plane is an A-plane, R-plane, or C-plane), SiC (having a structure of 6H, 4H or 3C), GaN, Si, ZnS, ZnO, AlN, LiMgO, $LiGaO_2$, GaAs, $MgAl_2O_4$, or InAlGaN. The above material preferably has a hexagonal or cubic system, and more preferably, has the hexagonal system. For example, in the case of using a sapphire substrate, the C-plane of sapphire may be taken as a principal plane of the sapphire substrate. Such a sapphire substrate with the C-plane of sapphire taken as the principal plane thereof has been often used for growing a gallium nitride (GaN) based compound semiconductor thereon. The C-plane of sapphire as the principal plane of the sapphire substrate used herein may contain a plane tilted from the strict C-plane of sapphire by an angle ranging from about 5° to about 6°.

It is noted that the plane terminology (e.g., S-plane, C-plane or the like) as used herein denotes crystal planes in accordance with Miller indices of a hexagonal crystal system. Where appropriate, throughout the specification, these planes are intended to include more than one plane in the hexagonal crystal system. For example, the S-plane is listed above as corresponding to the (1–101) plane, but it should be understood that, where appropriate, the S-plane is intended to include one or more of the planes relating to the family of planes making up a crystal structure having the S-plane. For example, if the crystal structure being described is a hexagonal pyramid having the S-plane, planes corresponding to each side face of the hexagonal pyramid would be included in the family of planes denoted by the S-plane. For example, in addition to the (1–101) plane, a hexagonal pyramid has side faces corresponding to the (10–11), (01–11), (-1101) and (0–111) planes.

The first growth layer 12 formed on the principal plane of the growth substrate 11 is preferably made from a wurtzite type compound semiconductor because a hexagonal pyramid structure is to be formed thereon in a subsequent step. Examples of the wurtzite type compound semiconductors may include a nitride semiconductor having a wurtzite type crystal structure, a BeMgZnCdS based semiconductor, a BeMgZnCdO based compound semiconductor, and the like.

As the nitride semiconductor having a wurtzite type crystal structure, there may be used a group III based compound semiconductor such as a gallium nitride (GaN) based compound semiconductor, an aluminum nitride (AlN) based compound semiconductor, an indium nitride (InN) based compound semiconductor, an indium gallium nitride (InGaN) based compound semiconductor, an aluminum gallium nitride (AlGaN) based compound semiconductor, or the like. In particular, a gallium nitride based compound semiconductor or an aluminum nitride based compound semiconductor is preferably used. It is to be noted that InGaN, AlGaN, or GaN does not necessarily mean a nitride semiconductor having a strict ternary or binary mixed structure. For example, an InGaN semiconductor may contain an impurity such as a trace of Al in a range not changing the function of InGaN without departing from the scope of the present invention. Additionally, a plane substantially equivalent to the S-plane may contain a plane tilted from the S-plane by an angle ranging from about 5° to about 6°. It is to be noted that in this specification, the term "nitride" means a compound which contains one or more of B, Al, Ga, In, and Ta as the group III elements and N as the group V element, and which may contain impurities in an amount of about 1% of the total amount or less, or about $1 \times 10^{20}$ $cm^3$ or less.

The first growth layer 12 may be grown on the growth substrate 11 by one of various vapor phase growth processes, for example, a metal organic chemical vapor deposition (MOCVD) (including a metal organic vapor phase epitaxy (MOVPE) growth process), a molecular beam epitaxy (MBE) growth process, a hydride vapor phase epitaxy (HVPE) growth process, or the like. The MOVPE process is advantageous in that the first growth layer 12 can be grown with high crystallinity at a high processing rate. In the MOVPE process, typically, alkyl metal compounds or the like are used as Ga, Al and In sources. Specifically, TMG (trimethylgallium) or TEG (triethylgallium) or the like may be used as the Ga source, TMA (trimethylaluminum) or TEA (triethylaluminum) or the like may be used as the Al source, and TMI (trimethylindium) or TEI (triethylindium) or the like may be used as the In source. In the MOVPE process, a gas such as ammonia or hydradine or the like may be used as a nitrogen source while silane gas or the like may be used as a Si (impurity) source. Also, germanium gas or the like may be used as a Ge (impurity) source, Cp2 Mg (cyclopentadienylmagnesium) or the like may be used as a Mg (impurity) source, and a DEZ (diethylzinc) gas or the like may be used as a Zn (impurity) source. According to the MOVPE process, these gases are supplied to a surface of a substrate heated, for example, at 600° C. or more, to be decomposed, whereby an InAlGaN based compound semiconductor is epitaxially grown on the substrate. Since the first growth layer 12 functions as a conductive layer to be connected to an n-side electrode, it is doped with an impurity such as silicon. While not shown, a specific buffer layer may be formed between the growth substrate 11 and the first growth layer 12.

Figure 1B:
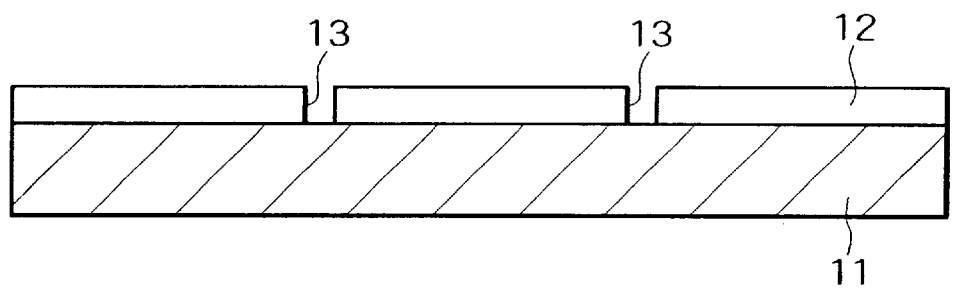

Referring to FIG. 1B, device isolation trenches 13 are formed by etching, such as reactive ion etching (RIE), to divide the first growth layer 12 into parts belonging to respective device regions. The depth of the device isolation trenches 13 is set to a value which nearly reaches the principal plane of the growth substrate 11 positioned under the first growth layer 12. The growth substrate 11 is exposed at bottoms of the device isolation trenches 13. The device isolation trenches 13 are formed in an approximately flat surface of the first growth layer 12 by photolithography. This is advantageous in that the device isolation trenches 13 are formed in the approximately flat surface of the first growth layer 12 before a second growth layer having a pyramid structure is formed on the first growth layer 12. Thus, it will be possible to relatively easily form a mask on the surface of the first growth layer 12 and also to accurately form the device isolation trenches 13.

Figure 1C:
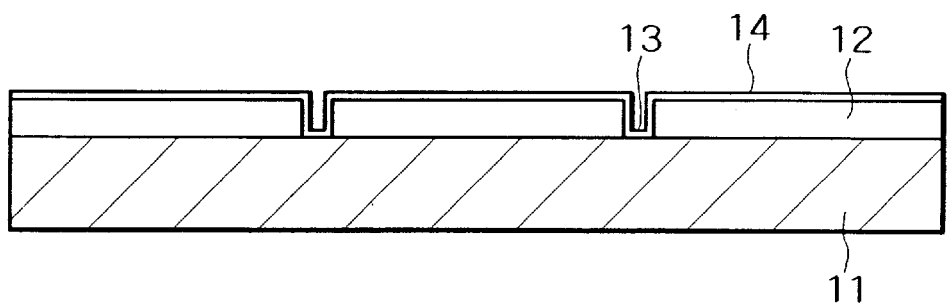

After the device isolation trenches 13 are formed so as to divide the first growth layer 12 into parts belonging to respective device regions, as shown in FIG. 1C, a growth obstruction film 14 made from silicon oxide or silicon nitride is formed on the overall surface. The growth obstruction film 14, which is to be used as a mask layer, is formed on the surface of the first growth layer 12 by sputtering or the like. Since the device isolation trenches 13 have already been formed in the first growth layer 12, the growth obstruction film 14 covers not only the surface of the first growth layer 12 but also bottom surfaces and side walls of the device isolation trenches 13. Thus, the whole of the first growth layer 12 is substantially covered with the growth obstruction film 14.

Figure 1D:
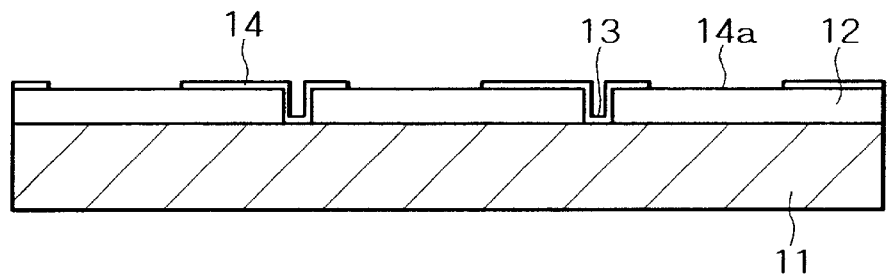

After the growth obstruction film 14 is formed overall on the first growth layer 12, as shown in FIG. 1D, the growth obstruction film 14 functioning as the mask is partially removed, to form opening portions 14a in the growth obstruction film 14. The shape of each of the opening portions 14a is not particularly limited insofar as a second growth layer will be formed by selective growth from the opening portion 14a such as to have a facet structure having tilt planes tilted from the principal plane of the substrate. For example, the shape of the opening portion 14a may be a stripe-shape, a rectangular shape, a circular shape, an elliptical shape, or a polygonal shape such as a triangular shape or a hexagonal shape. The surface of the first growth layer 12 positioned under the growth obstruction film 14 is exposed through the opening portions 14a.

Figure 1E:
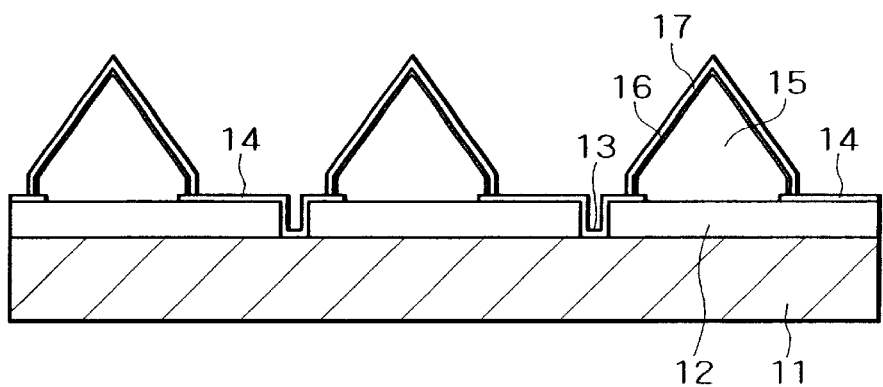

After the opening portions 14a, each having a specific shape, are formed, a second growth layer having a stacked structure is formed by selective growth. Referring to FIG. 1E, as the second growth layer having the stacked structure, a first conductive layer 15, an active layer 16, and a second conductive layer 17 are stacked. Like the first growth layer, the first conductive layer 15 is configured as a wurtzite type compound semiconductor layer. For example, the first conductive layer 15 may be made from silicon-doped GaN. The first conductive layer 15 functions as an n-type cladding layer. If a sapphire substrate with the C-plane of sapphire taken as the principal plane thereof is used as the growth substrate 11, the first conductive layer 15 is formed into a hexagonal shape which has an approximately triangular cross-section. The active layer 16 is a light emission layer of the light emitting device, and is configured as an InGaN layer or an InGaN layer sandwiched between AlGaN layers. The active layer 16 extends along a facet having tilt planes of the first conductive layer 15, and has a thickness suitable for light emission. The second conductive layer 17, which is configured as a wurtzite type compound semiconductor layer, is typically made from magnesium-doped GaN. The second conductive layer 17 functions as a p-type cladding layer. The second conductive layer 17 extends along the facet having the tilt planes of the first conductive layer 15, and has a thickness suitable for light emission. Each of the tilt planes of the hexagonal pyramid structure formed by selective growth is selected from an S-plane and a plane substantially equivalent thereto and a (11–22) plane and a plane substantially equivalent thereto.

Referring to FIG. 1E, as described above, if a sapphire substrate with the C-plane taken as the principal plane thereof is used as the growth substrate 11, the first conductive layer 15 is formed by selective growth into a hexagonal pyramid shape having an approximately triangular cross-section. An edge portion of the hexagonal pyramid shape is grown from the opening portion 14a in the lateral direction. At the time of this selective growth, since the growth obstruction film 14 is formed on the bottom surfaces and side walls of the device isolation trenches 13, the surface area of the growth obstruction film 14 is larger than that of a growth obstruction film formed on the surface of the first growth layer 12 in which the device isolation trenches 13 are not formed. Accordingly, the supplied amounts of source gases for Ga, In and the like to the bottoms of the opening portions 14a become larger. As a result, the first conductive layer 15, the active layer 16, and the second conductive layer 17 can be easily stacked. Since a growth obstruction area on the substrate is increased, it is possible to make an emission wavelength longer.

Figure 1F:
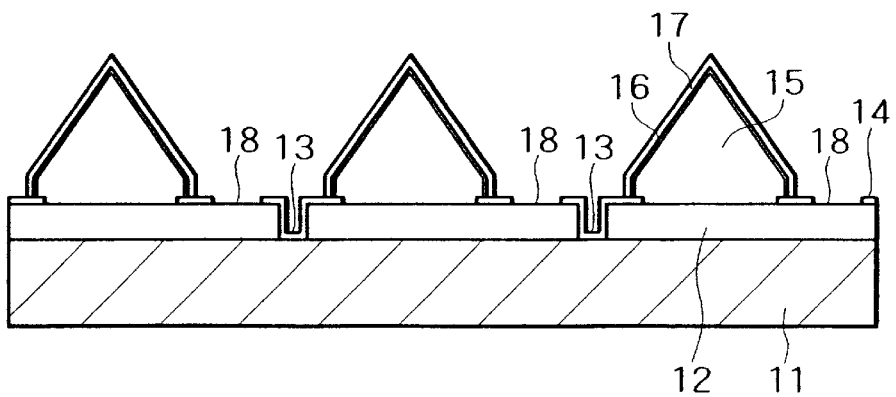

After the second conductive layer 17 is formed by selective growth, as shown in FIG. 1F, in each device region, the growth obstruction film 14 is opened at a position on a side (right side in the figure) of the hexagonal pyramid shaped second growth layer having an approximately triangular cross-section. Thus, an opening portion 18 is formed for exposing the surface of the first growth layer 12 as the conductive layer therethrough. To be more specific, the opening portion 18 is formed by partially removing the growth obstruction film 14 in each device region by way of etching using a mask patterned by photolithography.

Figure 1G:
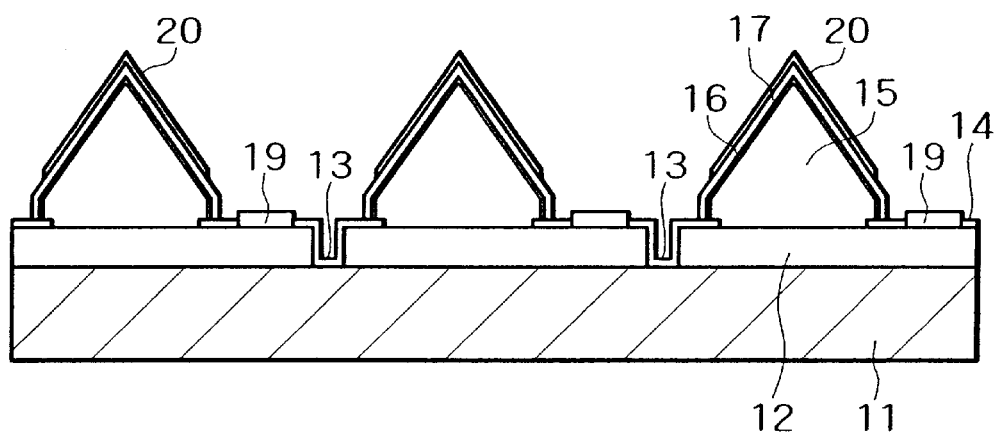

After the opening portion 18 is formed in each device region by partially removing the growth obstruction film 14, as shown in FIG. 1G, an n-side electrode 19 is formed in the opening portion 18, and a p-side electrode 20 is formed on the surface of the second conductive layer 17 located on the outermost portion of the hexagonal pyramid shaped second growth layer. The n-side electrode 19 typically has an electrode structure of Ti/Al/Pt/Au formed by vapor-deposition or the like. The p-side electrode 20 typically has an electrode structure of Ni/Pt/Au or Ni(Pd)/Pt/Au formed by vapor-deposition or the like.

Figure 1H:
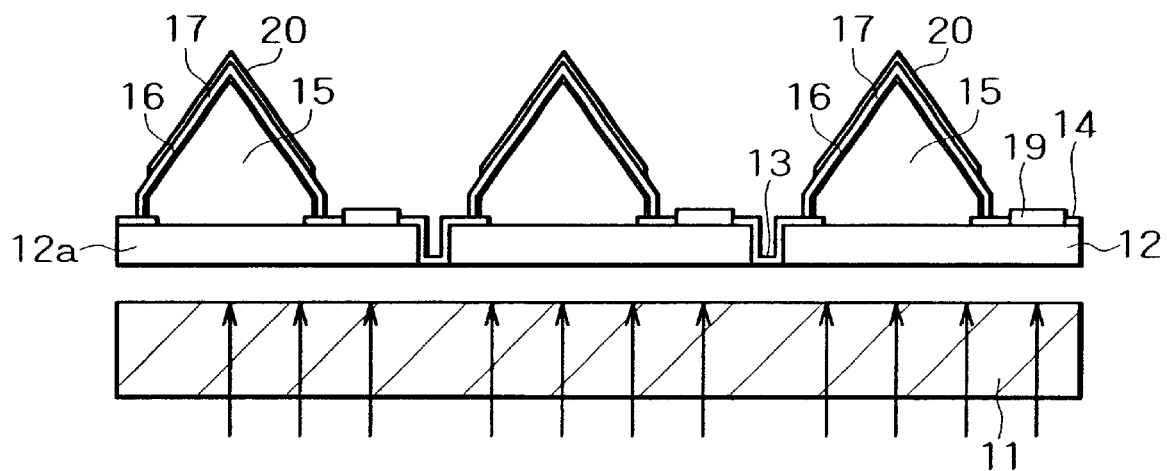

After formation of the n-side electrode 19 and the p-side electrode 20, as shown in FIG. 1H, the first growth layer 12 on the growth substrate 11 is irradiated with ultraviolet rays (e.g., excimer laser beams) from the bask surface side of the growth substrate 11. Thus, the first growth layer 12 is peeled from the growth substrate 11 by laser abrasion. The GaN based semiconductor layer is decomposed into metal Ga and nitrogen at a boundary between sapphire and the same by laser abrasion. Since the growth substrate 11 is composed of the sapphire substrate and the first growth layer 12 is composed of the GaN based semiconductor layer in this embodiment, the first growth layer 12 can be relatively simply peeled from the growth substrate 11 at the boundary therebetween by laser abrasion. Since the first growth layer 12 has already been divided into parts belonging to respective device regions by the device isolation trenches 13, respective devices isolated from each other are peeled from the growth substrate 11 by peeling the first growth layer 12 from the growth substrate 11 by laser abrasion. In place of the excimer laser beams, there may be used harmonic YAG laser beams or the like for causing laser abrasion.

The semiconductor light emitting devices isolated from each other and peeled from the growth substrate are then mounted on a light emitting unit such as a signal processing unit, an image display unit or an illumination unit at specific positions by a transfer process. In the above-described steps, the second growth layer having a hexagonal pyramid shape having an approximately triangular cross-section is formed by selective growth. However, a second growth layer having another pyramid shape or a truncated pyramid shape, or having a stripe-shape may be formed by selective growth. In this embodiment, the semiconductor light emitting device is configured as the light emitting diode. However, it may be configured as a semiconductor laser device.

According to the semiconductor light emitting device in this embodiment, since the device isolation trenches 13 are formed in an approximately flat surface of the first growth layer 12 by photolithography, a mask for forming the device isolation trenches 13 can be relatively easily formed. Thus, the device isolation trenches 13 can be accurately formed. According to this embodiment, even fine device isolation trenches can be easily formed. At the time of selective growth, since the growth obstruction film 14 is formed on the bottom surfaces and side walls of the device isolation trenches 13, a surface area of the growth obstruction film 14 is larger than that of a growth obstruction film formed on the surface of the first growth layer 12 in which the device isolation trenches 13 are not formed. Accordingly, since the supplied amounts of source gases to the bottoms of the opening portions 14a become larger, the second growth layer can be easily stacked. Further, since a growth obstruction area on the substrate becomes large, it is possible to make the emission wavelength longer.

Second Embodiment

A semiconductor light emitting device and a method of fabricating the semiconductor light emitting device according to a second embodiment will be described with reference to FIGS. 2A to 2C. In this embodiment, a semi-insulating layer is first formed on a growth substrate and then a first growth layer formed thereon, and wurtzite type compound semiconductor layers such as gallium nitride based compound semiconductor layers are formed thereon by selective growth. The semiconductor light emitting devices thus fabricated are independently driven on the growth substrate.

Figure 2A:
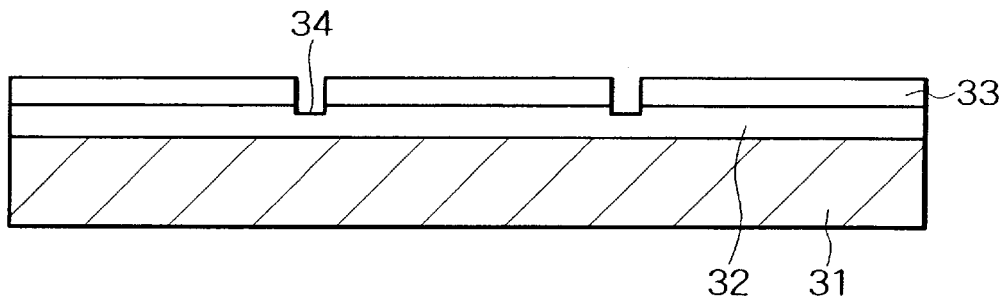

Referring to FIG. 2A, a semi-insulating layer 32 is formed on a growth substrate 31, and a first growth layer 33 is formed on the semi-insulating film 32. As the growth substrate 31, any kind of substrate may be used insofar as a wurtzite type compound semiconductor can be formed thereon in a subsequent step. Any of the substrates used for the growth substrate 11 in the first embodiment can be used. The semi-insulating layer 32 is typically a non-doped GaN layer or AlN layer, on which the first growth layer 33 is formed. The first growth layer 33 is preferably made from a wurtzite type compound semiconductor because a hexagonal pyramid shaped layer will be formed thereon in a subsequent step. The first growth layer 33 is typically made from silicon-doped GaN.

Device isolation trenches 34 are formed in the first growth layer 33 to a depth reaching the semi-insulating layer 32. Like the device isolation trenches in the first embodiment, the device isolation trenches 34 are provided for dividing the first growth layer 33 into parts belonging to respective device regions. The device isolation trenches 34 are typically formed by etching such as reaction ion etching (RIE) or the like. Since the device isolation trenches 34 are formed in an approximately flat surface of the first growth layer 33 by etching using a mask patterned by photolithography, it is possible to relatively easily form the mask on the surface of the first growth layer 33 and hence to form the device isolation trenches 34 with good or desirable repeatability.

Figure 2B:
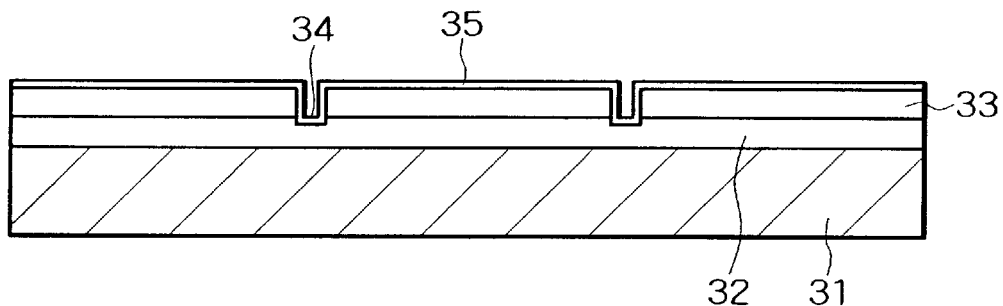

Referring to FIG. 2B, a growth obstruction film 35 made from silicon oxide or silicon nitride is formed on the overall surface so as to cover bottom surfaces and side walls of the device isolation trenches 34. The growth obstruction film 35, which is used as a mask layer, is formed on the surface of the first growth layer 33 by sputtering or the like.

Figure 2C:
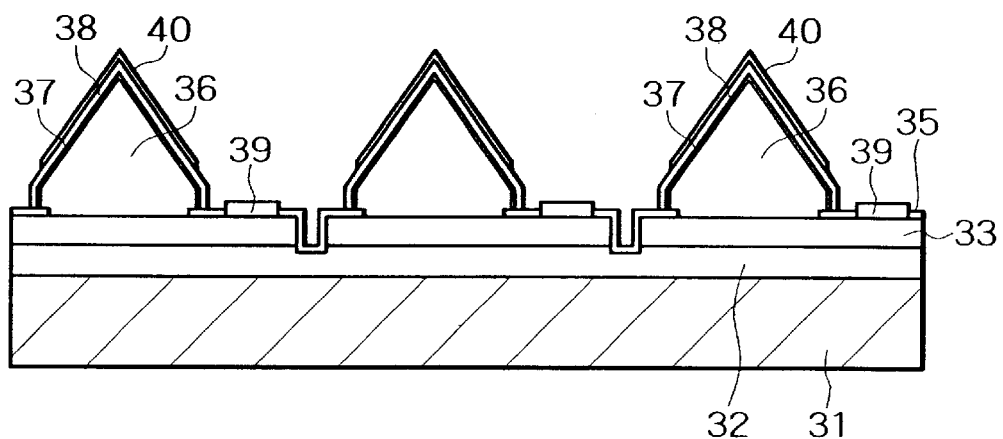

After the growth obstruction film 35 is formed on the overall surface, as shown in FIG. 2C, the growth obstruction film 35 functioning as the mask is partially removed, thereby forming an opening portion having a specific shape in each device region. A second growth layer having a stacked structure is then formed by selective growth from the opening portion. To be more specific, as the second growth layer having a stacked structure, a first conductive layer 36, an active layer 37, and a second conductive layer 38 are stacked. Like the first embodiment, the first conductive layer 36 functions as an n-type cladding layer. Like the first growth layer, the first conductive layer 36 is typically made from silicon-doped GaN. If a sapphire substrate with the C-plane taken as a principal plane thereof is used as the growth substrate 31, the first conductive layer 36 is formed into a hexagonal pyramid shape having an approximately triangular cross-section. The active layer 37 is a light emission layer of the light emitting device, and is typically configured as an InGaN layer or an InGaN layer sandwiched between AlGaN layers. The second conductive layer 38, which functions as a p-type cladding layer, is typically made from magnesium-doped GaN. Each of the active layer 37 and the second conductive layer 38 extends along a facet having tilt planes of the first conductive layer 36. It is to be noted that each of the tilt planes of the hexagonal pyramid structure formed by selective growth is selected from an S-plane and a plane substantially equivalent thereto and a (11–22) plane and a plane substantially equivalent thereto.

After the growth obstruction film 35 is partially opened, thereby forming an opening portion in each device region, an n-side electrode 39 is formed in the opening portion, and a p-side electrode 40 is formed on the surface of the second conductive layer located on the outermost portion of the hexagonal pyramid shaped second growth layer. The n-side electrode 39 typically has an electrode structure of Ti/Al/Pt/Au formed by vapor-deposition or the like. The p-side electrode 40 typically has an electrode structure of Ni/Pt/Au or Ni(Pd)/Pt/Au formed by vapor-deposition or the like.

According to the semiconductor light emitting device having the above-described configuration in this embodiment, after formation of the light emitting devices on the growth substrate 31, the growth substrate 31 is not peeled from the light emitting devices but used as a substrate for a light emitting unit composed of the light emitting devices. Since the device isolation trenches 34 reaching the semi-insulating layer 32 can sufficiently isolate the devices from each other, the semiconductor light emitting devices on the growth substrate 31 can be sufficiently, independently driven. Further, like the semiconductor light emitting device in the first embodiment, since the device isolation trenches 34 are formed in an approximately flat surface of the first growth layer 33 by photolithography, a mask for forming the device isolation trenches 34 can be relatively easily formed. Thus, the device isolation trenches 34 can be finely formed with good or desirable repeatability. At the time of selective growth, since the growth obstruction film 35 is formed on the bottom surfaces and side walls of the device isolation trenches 34, a surface area of the growth obstruction film 35 is larger than that of a growth obstruction film formed on the surface of the first growth layer in which the device isolation trenches 34 are not formed. Accordingly, since the supplied amounts of source gases to the bottoms of the opening portions become larger, the second growth layer can be easily stacked. Further, since a growth obstruction area on the substrate becomes large, it is possible to make the emission wavelength longer.

Third Embodiment

A semiconductor light emitting device and a method of fabricating the semiconductor light emitting device according to this embodiment will be described with reference to FIGS. 3A to 3F. In this embodiment, the semiconductor light emitting device is fabricated by forming wurtzite type compound semiconductor layers such as gallium nitride based compound semiconductor layers by selective growth. Further, an n-side electrode is extracted from a central portion of a second growth layer.

Figure 3A:
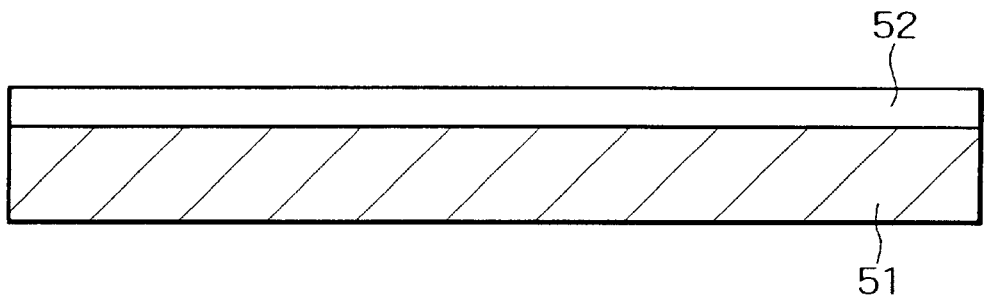

Referring to FIG. 3A, a first growth layer 52 is formed on a growth substrate 51. As the growth substrate 51, any kind of substrate may be used insofar as a wurtzite type compound semiconductor can be formed thereon in the subsequent step. Any of the substrates used for the growth substrate 11 in the first embodiment may be used. The first growth layer 52 is preferably made from a wurtzite type compound semiconductor because a hexagonal pyramid shaped layer will be formed thereon in a subsequent step.

Figure 3B:
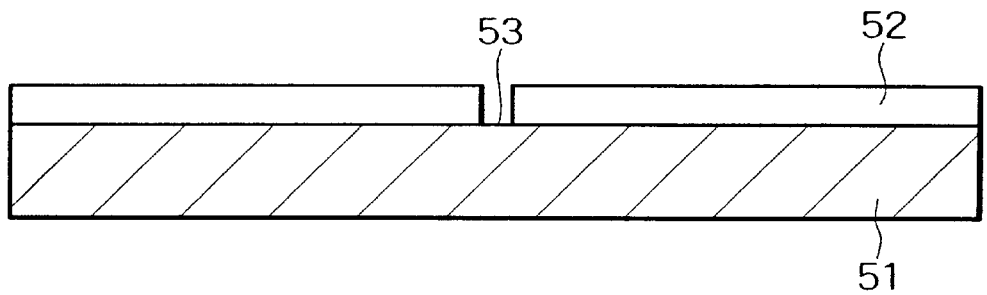

Referring to FIG. 3B, device isolation trenches 53 are formed in the first growth layer 52 to a depth reaching the growth substrate 51 positioned under the first growth layer 52. Like the device isolation trenches in the first embodiment, the device isolation trenches 53 are provided for dividing the first growth layer 52 into parts belonging to respective device regions. The device isolation trenches 53 are typically formed by etching such as reaction ion etching (RIE) or the like. Since the device isolation trenches 53 are formed in an approximately flat surface of the first growth layer 52 by etching using a mask patterned by photolithography, it is possible to relatively easily form the mask on the surface of the first growth layer 52 and hence to form the device isolation trenches 53 with good or desirable repeatability.

Figure 3C:
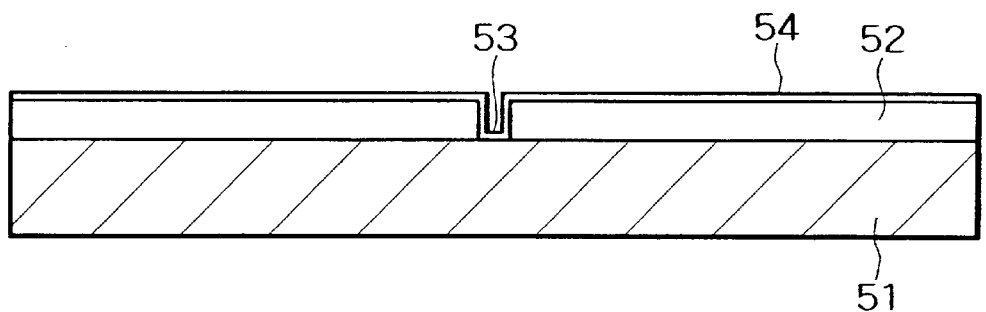

Referring to FIG. 3C, a growth obstruction film 54 made from silicon oxide or silicon nitride is formed on the overall surface so as to cover bottom surfaces and side walls of the device isolation trenches 53. The growth obstruction film 54, which is used as a mask layer, is formed on the surface of the first growth layer 52 by sputtering or the like.

Figure 3D:
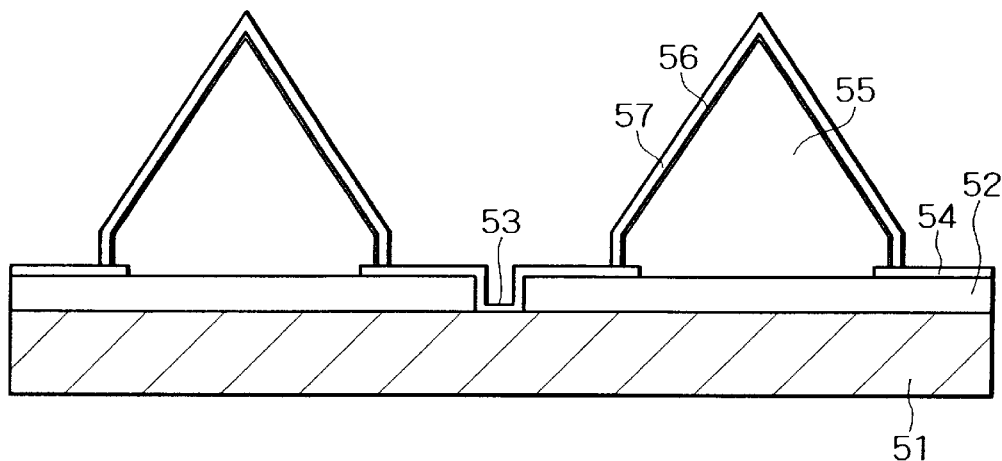

After the growth obstruction film 54 is formed on the overall surface, as shown in FIG. 3D, the growth obstruction film 54 functioning as the mask is partially removed, thereby forming an opening portion having a specific shape in each device region. A second growth layer having a stacked structure is then formed by selective growth from the opening portion. To be more specific, as the second growth layer having a stacked structure, a first conductive layer 55, an active layer 56, and a second conductive layer 57 are stacked. Like the first embodiment, the first conductive layer 55 functions as an n-type cladding layer, and is typically made from silicon-doped GaN. If a sapphire substrate with the C-plane of sapphire taken as a principal plane thereof is used as the growth substrate 51, the first conductive layer 55 is formed into a hexagonal pyramid shape having an approximately triangular cross-section. The active layer 37 is a light emission layer of the light emitting device, and is typically configured as an InGaN layer or an InGaN layer sandwiched between AlGaN layers. The second conductive layer 57, which functions as a p-type cladding layer, is typically made from magnesium-doped GaN. Each of the active layer 56 and the second conductive layer 57 extends along a facet having tilt planes of the first conductive layer 55. It is to be noted that each of the tilt planes of the hexagonal pyramid structure formed by selective growth is selected from an S-plane and a plane substantially equivalent thereto and a (11–22) plane and a plane substantially equivalent thereto.

Figure 3E:
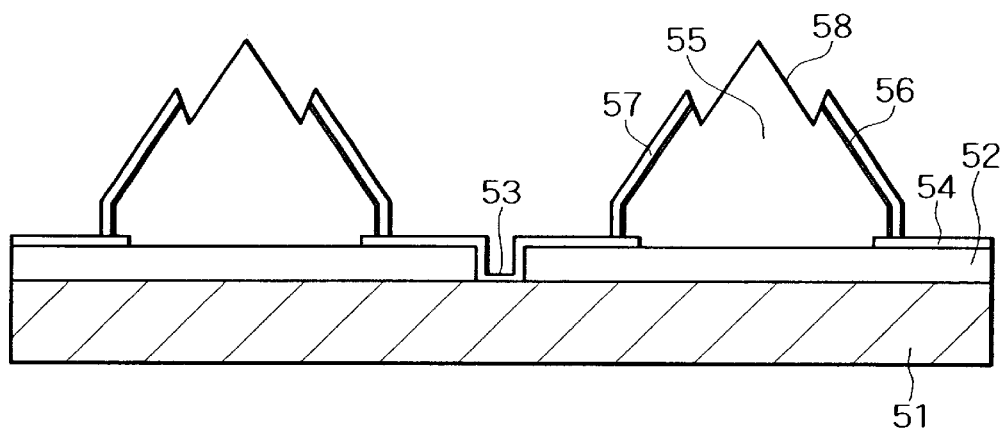

Referring to FIG. 3E, a central portion of the second growth layer having the stacked structure of the first conductive layer 55, the active layer 56, and the second conductive layer 57 is opened so as to form an opening portion 58. Part of the first conductive layer 55 is exposed through the opening portion 58. In general, a central portion of a hexagonal pyramid shaped growth layer formed by selective growth is poor in crystallinity and is therefore undesirable for light emission. According to this embodiment, the central portion of the hexagonal pyramid shaped second growth layer is removed, thereby improving a light emission characteristic.

Figure 3F:
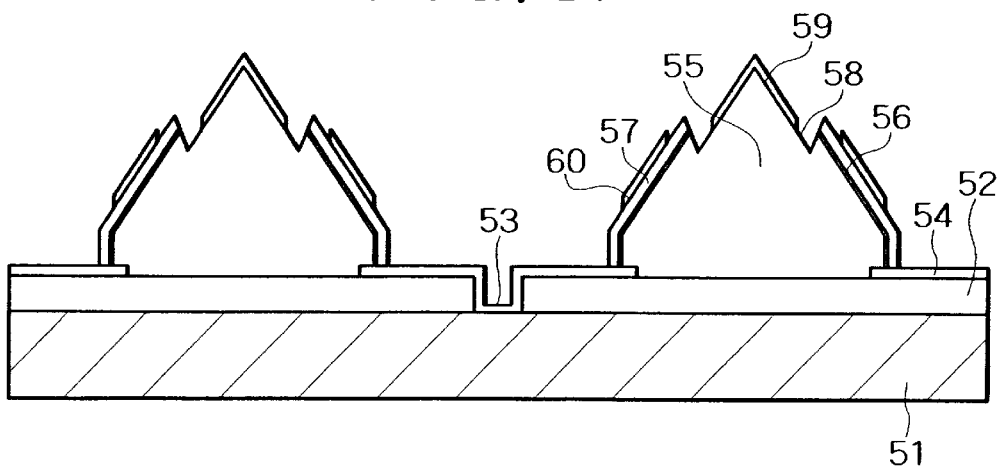
Figure 4A:
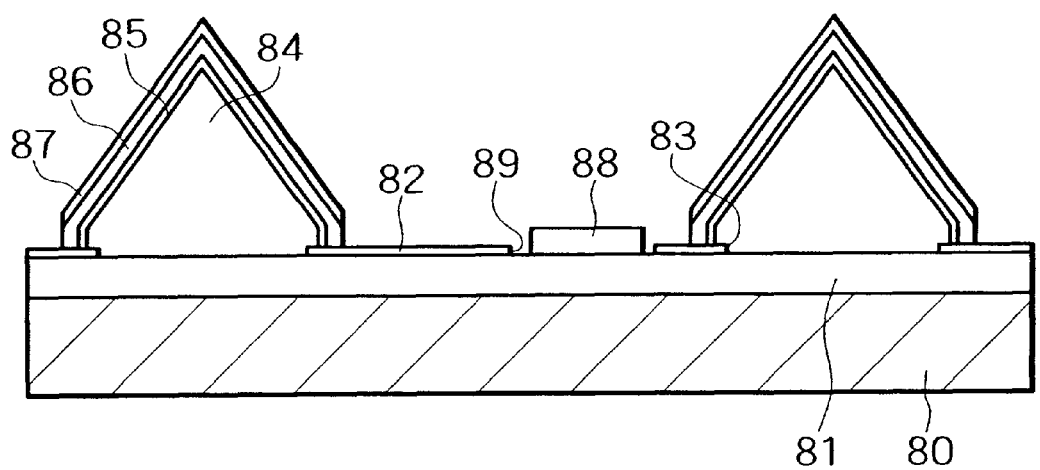
Figure 4B:
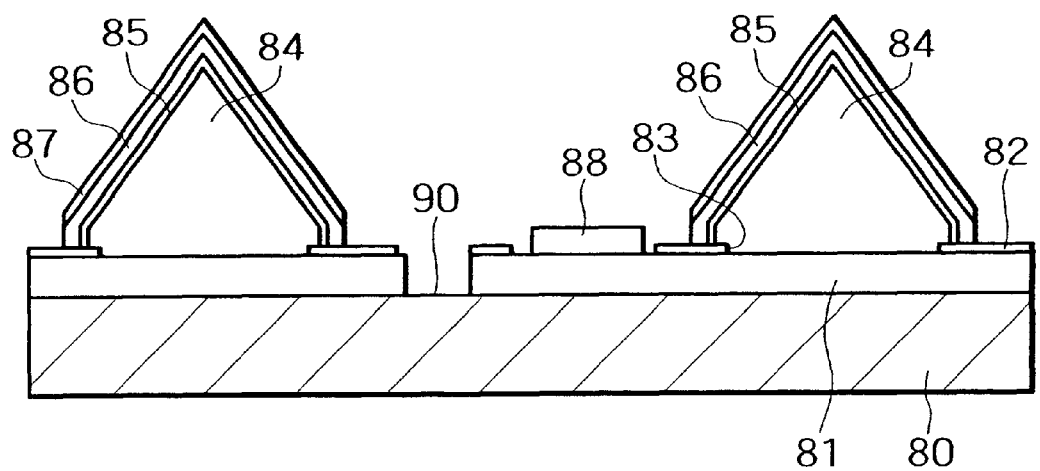

After formation of such an opening portion 58, as shown in FIG. 3F, an n-side electrode 59 is formed in the opening portion 58, and a p-side electrode 60 is formed on the surface of the second conductive layer 57 located on the outermost portion of the hexagonal pyramid shaped second growth layer. The n-side electrode 59 typically has an electrode structure of Ti/Al/Pt/Au formed by vapor-deposition or the like. The p-side electrode 60 typically has an electrode structure of Ni/Pt/Au or Ni(Pd)/Pt/Au formed by vapor-deposition or the like.

The semiconductor light emitting device in this embodiment has the structure that the first growth layer is not used for connection to the n-side electrode. Since the device isolation trenches 53 are formed in an approximately flat surface of the first growth layer 52, a mask for forming the device isolation trenches 53 can be relatively easily formed. Thus, the device isolation trenches 53 can be finely formed with desirable repeatability. At the time of selective growth, since the growth obstruction film 54 is formed on the bottom surfaces and side walls of the device isolation trenches 53, a surface area of the growth obstruction film 54 is larger than that of a growth obstruction film formed on the surface of the first growth layer in which the device isolation trenches 53 are not formed. As a result, since the supplied amounts of source gases to the bottoms of the opening portions become larger, the second growth layer can be easily stacked. Since a growth obstruction area on the substrate becomes large, it is possible to make the emission wavelength longer. In addition, according to this embodiment, since the central portion of the hexagonal pyramid shaped second growth layer, which is generally poor in crystallinity, is removed, it is possible to improve the light emission characteristic.

As described above, according to the semiconductor light emitting device and the method of fabricating the semiconductor light emitting device, since the device isolation trenches are formed in an approximately flat surface of the first growth layer by photolithography, a mask for forming the device isolation trenches can be relatively easily formed. Thus, the device isolation trenches can be formed with desirable repeatability. According to an embodiment of the present invention, even fine device isolation trenches can be easily formed. At the time of selective growth, since the growth obstruction film is formed on the bottom surfaces and side walls of the device isolation trenches, a surface area of the growth obstruction film is larger than that of a growth obstruction film formed on the surface of the first growth layer in which the device isolation trenches are not formed. Accordingly, since the supplied amounts of source gases to the bottoms of the opening portions become larger, the second growth layer can be easily stacked. Further, since a growth obstruction area on the substrate becomes large, it is possible to make the emission wavelength longer.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A semiconductor light emitting device, comprising:
   a growth substrate;
   a first growth layer formed on said growth substrate;
   a growth obstruction film formed on said first growth layer;
   a second growth layer formed by selective growth from an opening portion formed in said growth obstruction film, said second growth layer having a stacked structure of a first conductive layer, a light emission layer, and a second conductive layer; and
   device isolation trenches for isolating devices from each other, said device isolation trenches being formed in said first growth layer formed on said growth substrate;
   wherein said second growth layer is formed by selective growth after formation of said device isolation trenches.

2. A semiconductor light emitting device according to claim 1, wherein said device isolation trenches have a depth reaching a principal plane of said growth substrate.

3. A semiconductor light emitting device according to claim 1, wherein said growth obstruction film is formed on side walls and bottoms of said device isolation trenches.

4. A semiconductor light emitting device according to claim 1, wherein said growth obstruction film is one of a silicon oxide film, a silicon nitride film, and a combination thereof.

5. A semiconductor light emitting device according to claim 1, wherein each of said first growth layer and said second growth layer is a wurtzite type compound semiconductor layer.

6. A semiconductor light emitting device according to claim 5, wherein said wurtzite type compound semiconductor layer is a gallium nitride based compound semiconductor layer.

7. A semiconductor light emitting device according to claim 1 wherein said second growth layer formed by selective growth from said opening portion has one of a pyramid shape and a truncated pyramid shape.

8. A semiconductor light emitting device according to claim 7, wherein said pyramid shaped second growth layer has a facet structure having a tilt plane tilted from a principal plane of said growth substrate.

9. A semiconductor light emitting device according to claim 8, wherein said tilt plane is a plane selected from one of an S-plane and a plane substantially equivalent thereto, and a (11–22) plane and a plane substantially equivalent thereto.

10. A semiconductor light emitting device according to claim 1, wherein said first growth layer is a conductive layer, and said device isolation trenches are formed such as to divide said conductive layer into parts isolated from each other.

11. A semiconductor light emitting device according to claim 1, wherein said first growth layer has a stacked structure of a semi-insulating layer and a conductive layer formed thereon, and said device isolation trenches are formed such as to divide said conductive layer into parts isolated from each other.

12. A method of fabricating a semiconductor light emitting device, the method comprising the steps of:
    forming a first growth layer on a growth substrate;
    forming device isolation trenches for isolating devices from each other in said first growth layer;
    forming a growth obstruction film having a specific opening portion in said first growth layer in which said device isolation trenches have been formed; and
    forming a second growth layer by selective growth from said opening portion, said second growth layer having a stacked structure of a first conductive layer, a light emission layer, and a second conductive layer.

13. A method of fabricating a semiconductor light emitting device according to claim 12, wherein said second growth layer has one of a pyramid shape and a truncated pyramid shape.

14. A method of fabricating a semiconductor light emitting device according to claim 13, wherein said pyramid shaped second growth layer has a facet structure having a tilt plane tilted from a principal plane of said growth substrate.

15. A method of fabricating a semiconductor light emitting device according to claim 14, wherein said tilt plane is a plane selected from one of an S-plane and a plane substantially equivalent thereto, and a (11–22) plane and a plane substantially equivalent thereto.

16. A method of fabricating a semiconductor light emitting device according to claim 12, wherein each of said first growth layer and said second growth layer is a wurtzite type compound semiconductor layer.

17. A method of fabricating a semiconductor light emitting device according to claim 16, wherein said wurtzite type compound semiconductor layer is a gallium nitride based compound semiconductor layer.

* * * * *